(12) United States Patent
De Jongh et al.

(10) Patent No.: US 6,998,688 B2
(45) Date of Patent: Feb. 14, 2006

(54) ARRANGEMENT FOR PROTECTING A CHIP AND CHECKING ITS AUTHENTICITY

(75) Inventors: Petra Elisabeth De Jongh, Eindhoven (NL); Reinder Coehoorn, Eindhoven (NL); Nynke Anne Martine Verhaegh, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/510,900

(22) PCT Filed: Apr. 4, 2003

(86) PCT No.: PCT/IB03/01405

§ 371 (c)(1),
(2), (4) Date: Oct. 8, 2004

(87) PCT Pub. No.: WO03/085410

PCT Pub. Date: Oct. 16, 2003

(65) Prior Publication Data

US 2005/0116307 A1    Jun. 2, 2005

(30) Foreign Application Priority Data

Apr. 9, 2002    (EP) .................... 02076389

(51) Int. Cl.
*H01L 27/14* (2006.01)
(52) U.S. Cl. .................. 257/414; 235/449; 235/487; 235/492; 235/493
(58) Field of Classification Search ............ 235/449, 235/487, 492, 493
See application file for complete search history.

(56) References Cited

U.S. PATENT DOCUMENTS 6,764,005 B1 * 7/2004 Cooper ................ 235/449

FOREIGN PATENT DOCUMENTS

EP    0 993 653    4/2000

* cited by examiner

*Primary Examiner*—Mai-Huong Tran
(74) *Attorney, Agent, or Firm*—Peter Zawilski

(57) ABSTRACT

The semiconductor device has a security coating with embedded magnetic particles and magnetoresistive sensors. This renders possible a measurement of the impedance of security elements defined by magnetoresistive sensors and security coating. If initial values of the impedance are stored, actual values can be compared therewith to see if the device has not been electrically probed or modified. Such a comparison can be used to check the authenticity of the device.

11 Claims, 6 Drawing Sheets

ARRANGEMENT FOR PROTECTING A CHIP AND CHECKING ITS AUTHENTICITY

The invention relates to a semiconductor device provided with a circuit, a security layer that covers the circuit and a security element comprising a local area of the security layer and a sensor.

The invention also relates to a carrier provided with a semiconductor device and a card reader.

The invention further relates to a method of initializing and a method of checking the authenticity of the semiconductor device.

Such a semiconductor device and such a carrier are known from EP-A 300864. The security element of the known device is a capacitor with as its sensor two capacitor electrodes that are coupled capacitively together by the security layer. The device comprises a plurality of security elements by preference. On checking the authenticity of the device, a measured voltage is compared with a calculated reference voltage. If there is a difference, the authenticity is not recognized. The carrier on which the device is present is a smartcard.

It is a disadvantage of the known device that the security elements can be circumvented. The security elements may be replaced by other structures with the same capacitance which leave the underlying circuit free. Furthermore, the removal of the security layer and the electrodes cannot be detected if the electrodes and the security layer are reapplied afterwards. Such removal is done in order to look at, to probe electrically, and/or to modify the circuit.

It is therefore a first object of the invention to provide a semiconductor device of the kind mentioned in the opening paragraph, of which removal of the security layer can be detected afterwards.

It is a second object of the invention to provide a carrier with an improved detection of hacking.

The first object is realized in that:
 the security layer comprises embedded magnetic particles, and
 the sensor is a magnetic sensor capable of measuring a magnetic property of the security layer.

The second object is realized in that the carrier comprises the semiconductor device of the invention.

The two features of the invention—the embedded magnetic particles and the sensor to measure a magnetic property thereof—form in combination a very good system of protection of any semiconductor device. The essence hereof is furthermore that both the sensor and the embedded magnetic particles are implemented on the chip; this also means that the mutual position does not change. Hence, any uncertainty in the measurement of the magnetic property is considerably reduced. Furthermore, the measurement can be completely hidden for any user or hacker. If the values of the magnetic property are stored on the chip itself, there need not to be any communication to the outside world. Furthermore, any magnetic property can be converted easily into values that can be transferred to an outside reader using standard protocols. Possible magnetic sensors include magnetoresistive sensors, but also all kinds of inductors. It is for the ease of signal processing preferred that the sensor can convert the magnetic signal into an electrical or digital signal. These two features will now be discussed in extenso one after the other.

The use of magnetic particles has the advantage that they are substantially inert and that its properties are stable. Furthermore, it is not or hardly possible to provide a security layer with the same magnetic properties after removal of the original security layer. A removal of the security layer can be detected in that at an initialization an actual value is compared with an initial value that has been stored in a memory as a reference value. The memory may be present outside the semiconductor device. This has the advantage that one and the same value is available in two locations in the semiconductor device, and that communication with an external, central database device is not necessary to check the authenticity. Alternatively, the memory can be present external to the semiconductor device. This has the advantage that it is not possible to modify the memory and the security layer such that both the reference value and the actual value are different from the original values but nevertheless equal. Preferably, a plurality of security elements is present.

It is preferred that the embedded magnetic particles are inhomogeneously distributed over the circuit. The inhomogeneous distribution of the particles gives the security element an impedance that is specific and unpredictable. The inhomogeneous distribution of magnetic particles in the security layer over the circuit can be realized in various ways. If the layer is prepared from a particle suspension containing a sol-gel precursor, an inhomogeneity in the distribution of particles will naturally be present. This inhomogeneity can be further enhanced by variation of the suspension parameters, for example by deliberately creating an unstable suspension. Another possibility is by deposition according to a desired pattern. It is advantageous that the suspension comprises a sol-gel precursor, such as a precursor for silica, titania, zirconia, or aluminophosphates. The inhomogeneity may be of chemical nature—for example chemically different magnetic particles or different compositions of magnetic particles—and of physical nature—for example different particle sizes, or otherwise.

It is furthermore advantageous that, the inhomogeneous distribution is provided by the addition of non-magnetic particles. This has the result that not only the lateral positions of the magnetic particles, but also or even mainly the vertical positions of the magnetic particles vary over the circuit. As will be understood, the terms 'vertical' and 'lateral' are used in this context with respect to a plane of reference parallel to the security layer.

The magnetic particles may be any kind of magnetic particles, such as ferromagnetic-, and ferrimagnetic particles. Ferrite particles, such as $BaFe_{12}O_{19}$, could be used. If the nature of the precursor suspension is incompatible with the magnetic particles, the magnetic particles can be protected by encapsulation, for example in $SiO_2$ or in a polymer.

As is known to those skilled in the art, magnetic particles can be subdivided on the basis of their hardness. A parameter for this hardness is the strength of the coercive field $H_c$. A second parameter characterizing the hardness of a magnetic material is the ratio R of the remanent magnetization $M_r$ to the saturation magnetization $M_{sat}$. The remanent magnetization is defined as the magnetization at a zero external field, obtained after a magnetic saturation step. Softmagnetic materials that are suitable for transformers and inductors have an $H_c$ value that is small in an absolute sense and have $R \ll 1$. Magnetic materials with a higher $H_c$ and a large R are used for magnetic recording or even as permanent magnets—together also referred to as hardmagnetic materials. Both soft- and hardmagnetic materials can be used in the device of the invention, however in different embodiments.

In a first embodiment, magnetic particles of a softmagnetic material are used, which particles have a diameter on a submicron scale, and preferably of less than 100 nanometers. Such particles are known as superparamagnetic particles and are ferromagnetic and ferrimagnetic particles which are so small that, in the absence of an external field, their magnetization fluctuates on a time scale that is much shorter than the time period during which a magnetization measurement is carried out. Preferably, a plurality of these particles is provided in an inert, micrometer-sized matrix, and is as such present in the security coating. Such a matrix with superparamagnetic particles is commercially available and known as a microbead. The softmagnetic material is, for example magnetite or a cubic ternary ferrite. With such materials a short measurement time of less than 1 Second, preferably of the order of 0.001 to 0.1 Second, can be realized. This is due to the small response time to the application of a magnetic field of superparamagnetic nanoparticles made of these materials. The response time is given by an Arrhenius expression, according to which the response time is an exponential function of the product of the magnetic anisotropy energy density and the particle volume.

The advantage of the superparamagnetic particles is that their magnetization M fluctuates on a time scale that is much shorter than the time period in between of two measurements. As a consequence, the resultant magnetization field $H_{//,Sx}$ parallel to the security layer and at a specific magnetoresistive sensor $S_x$ can be assumed to be zero at the beginning of a measurement. Upon application of an external magnetic field, a magnetization is induced in the direction parallel to this external magnetic field. This magnetization induces a magnetic dipole field around the particles, which has a significant component perpendicular to the externally applied magnetic field and substantially parallel to the security layer. The resultant magnetization field $H_{//,Sx}$ will be different and will induce changes in the resistivity of the magnetoresistive sensors. The magnitude of the resultant magnetization field $H_{//,Sx}$ will be dependent on the amount of particles, and on the distance and location with respect to the magnetoresistive sensor.

In a second embodiment, particles of a hard-magnetic material—hard-magnetic particles—are used. The hard-magnetic particles may be of any kind or size, and preferably have an average diameter ranging from 0.1 to 3 microns. This average diameter is preferably much smaller than the thickness of the security layer, which may be as thick as 10 microns or more.

Two sub-classes of hard-magnetic particles are distinguished. If the coercive field of the particles is much larger than the maximum field that can be allowed to be applied to the chip during its lifetime, the magnetization direction of each of the particles will be permanently fixed after magnetizing them once during the fabrication process. The measurement of the value of the security elements does then comprise the step of measuring the resistance of the sensor, without the application of an external magnetic field. This value is directly compared with the reference value obtained after the initialization step.

Within the second sub-class, an external magnetic field must be applied in order to induce the magnetization. Within this second sub-class, the coercive field of the particles is smaller than or approximately equal to the maximum field that can be allowed to be applied during the lifetime of the chip. The application of a field larger than the coercive field changes the magnetic state of the particles. The particles must therefore be brought into a reference state, in order to remove influences of any uncontrolled previously applied external magnetic field. A suitable example of a preliminary treatment is degaussing. In this treatment, generally applied in cathode ray tubes, an alternating magnetic field is applied. The strength of this field is initially equal to or larger than a saturation field of the hardmagnetic particles, but is reduced at every alternation to end at a standard value, in general a zero field.

The measurement of the value of the security elements with hardmagnetic particles within this second sub-class can be the same as for the particles of a softmagnetic material. This will comprise the steps of measuring a resistance of the sensor at a reference state in a zero applied field, applying an external field in a direction substantially perpendicular to the plane of the security layer, said external field having a strength of at least the saturation magnetic field, and measuring the resistance again. The second measurement is preferably started after the resultant magnetization field $H_{//,Sx}$ has reached its saturation value and stopped before the external field is switched off.

Alternatively, the external field may be zero or of a strength below the saturation magnetic field of the hardmagnetic particles, which has the advantage that the level of security is enhanced and that the application of the external field has no or a weaker direct influence on the resistance of the sensor. In a phase prior to the measurement, the field may further be applied in a degaussing manner to end up around said bias value below the saturation magnetic field. Subsequently, a measurement is carried out. A special case is that in which the measurement is carried out at zero field.

It is possible to create a well-defined remanent state of the magnetic particles that is different from that in the reference state by making use of a variation in time of the external field prior to the measurement that is different than that used for obtaining the reference state. The resultant resistivity that is measured is thus not only dependent on the size and specific distribution of the magnetic particles in the security layer, but also on their detailed hysteretic magnetic response to a time-dependent magnetic field. This enhances the level of security for two reasons. Firstly, a prediction of the remanent magnetization of a particle after a degaussing procedure on the basis of a measurement of only the volume and of the full hysteresis loops is impossible in practice, because the so-called inner hysteresis loops depend on detailed internal magnetic states of the particle that are not probed when measuring a full magnetization loop, and because such inner loops are already strongly modified by weak and random variations of the particle properties that cannot be detected in practice. Secondly, the sensor responses obtained after many different degaussing procedures can be compared to those obtained in a corresponding way in the initialization procedure. Such responses are very specific and are to be considered as a 'magnetic signature'. The degaussing procedures can be varied in length and character, as will be clear to those skilled in the art. Also, use can be made of the full time dependence of the response.

In a further embodiment, superparamagnetic particles, or a mixture of such particles, are chosen such that its or their relaxation time is comparable to the measurement time. As a consequence, the time dependence of the resistivity can be used in addition to the absolute value of the resistivity. This time dependence of the resistivity can be measured by the magnetoresistive sensors after the application of a—sudden—fixed magnetic field.

As explained above, various magnetic sensors can be used including magnetoresistive sensors and inductors.

In one embodiment, the magnetic sensor is an inductor. It has been found that the magnetic property can be well measured in a stable manner using nothing more than an inductor as magnetic sensor. In this embodiment, it is suitable to use ferromagnetic particles, such as ferrites, and particularly but not exclusively magnesiumzincferrites. It is therewith preferred that these ferromagnetic particles have a high magnetic permeability, for instance $\mu \geq 1000$. This leads to a reduced sensitivity for an external magnetic field, but a high sensitivity for the inductors. It is therewith preferred to measure the magnetic property of the ferromagnetic particles at higher frequencies, for instance in the MHz range. Ferrite particles have the advantage that they are available in any desired magnetic permeability and in any diameter, and that they are completely stable.

The inductors are preferably embodied in the upper layer of the interconnect structure or even on top of any passivation layer, if present. They may have any suitable shape, which depends on the kind of magnetic particles used, and therewith the effect to be measured, as well as one the available space for one sensor. Principally, there are at least two kinds of shapes for the turns of the inductor. The one shape uses rectangular turns. This has the advantage that the turns can be effectively hidden in the interconnect structure, for instance in that the turn is interrupted in one plane, but continued in an underlying plane and connected thereto with vertical interconnects. The other shapes uses circular or oval windings. This has the advantage of limited space and optimal sensitivity. The sensor can be provided with only one turn, for instance with a diameter of 1–200 $\mu$m, preferably about 10– 20 $\mu$m. It can further be provided with a spirally shaped winding. A second inductor may be provided concentrically in said spirally shaped winding. A further structure with appears very suitable is the so-called C-pad structure. In this structure the core of the inductor is formed by a bond pad, or vertical interconnect area.

In another preferred embodiment, the magnetic sensor is a magnetoresistive sensor capable of converting of the magnetic properties into an impedance value. With the magnetoresistive sensor, the magnetization that results from the distribution of the particles is transformed into impedance values. Thus the impedance can be measured on-line. This has the advantage that any actual value of the impedance can be further processed, digitized, and stored in an easy manner which is known in principle. In the context of this application, the term 'impedance' relates to the impedance as measured in the magnetoresistive sensor. This impedance is in fact an impedance induced by instantaneous changes in the magnetization in the security element. These changes can be provided by changing the magnitude of an external magnetic field, and especially by switching such an external magnetic field on and/or off. The impedance of the magnetoresistive sensor is generally obtained as the difference between the sensor voltages in the reference state and in a magnetic field, which difference is divided by the sensor current used in the magnetoresistive sensor. The voltages are preferably, the voltages of a Wheatstone bridge present in the sensor.

In an advantageous embodiment, the first security element comprises a Wheatstone-bridge having a first pair of magnetoresistive sensors and a second pair of sensors, the sensors of which first and second pair are provided with substantially the same resistance versus magnetic field characteristic. Said characteristic is implemented through the physical and the magnetic structure, for example the sensors have the same size and contain the same material, and the pinned layer is pinned in the same direction in all the sensors of the bridge. The use of a Wheatstone bridge increases the sensitivity of the security element for variations in the impedance because it is not the impedance itself, but a difference in impedance between the first and the second magnetoresistive sensors of the first pair—and optionally the second pair—that is measured. Besides, with a Wheatstone bridge the measurement is independent of temperature changes and compensates for a constant background field. This Wheatstone bridge is known per se to those skilled in the art of magnetoresistive sensors. The term Wheatstone bridge is understood to include, in the context of this application, a so-called half Wheatstone bridge comprising a first pair of magnetoresistive sensors and a second pair of identical non-magnetic elements; a full Wheatstone bridge including a first and a second pair of magnetoresistive sensors; and any modification of a Wheatstone bridge. The magnetoresistive sensors may be of various types such ask GMR, TMR, and AMR and are known per se. Besides a standard magnetoresistive sensor as described with reference to the drawings, more complex sensors may be used. Examples thereof are spin valves with dusting layers, specular spin valves, spin valves with artificial antiferromagnets as pinned layers. If there is a passivation layer under the security layer, the magnetoresistive sensors may be present on either side of this passivation layer.

In a further embodiment, the security element has a construction wherein the magnetoresistive sensors having an axis of sensitivity substantially parallel to the security layer are shaped as stripes that have a length in a direction substantially perpendicular to the axis of sensitivity. The magnetoresistive sensors of this embodiment are robust in the sense that a deviation of the magnetic field from the direction perpendicular to the security layer is not harmful. Generally such a deviation is harmful if it saturates the sensor.

Preferably, the passivation structure comprises a plurality of security elements. These elements may all be security elements comprising at least one magnetoresistive sensor. However, it may equally well be that various types of security elements are present. Other types of security elements include capacitors, resistors, inductors, and combinations thereof, wherein the passivation structure comprises a layer with a varying dielectric constant laterally across the circuit.

As will be explained in more detail below, the impedance measured in the security element must be converted into a signal that can be stored in a memory, either inside the semiconductor device or in any reader or database connected to the reader. To this end, conversion means are present to convert an output voltage from the first security element into an actual value of the first impedance. The conversion means may be of well-known nature, such as an A/D-converter or any circuit based on a comparison with a predetermined clock-frequency.

The carrier of the invention may be a smartcard, a record carrier such as an optical disc, or a security paper such as a banknote.

It is a third object of the invention to provide a card reader with which the authenticity of the semiconductor device of the invention can be checked.

The third object is realized in a card reader suitable for a card with a semiconductor device of the invention, in which card reader magnetization means are present in order to generate an external magnetic field that will induce a magnetization in the magnetic particles substantially perpendicular to the security layer. The external magnetic field to be generated preferably has a strength of the order of 10 to 100 kA/m. Examples of magnetization means include a coil and a permanent magnet. If a coil is used, it may be provided with a core, for example of ferrite material. Furthermore, a number of coils or magnets that are placed in parallel to each other and are electrically connected in series may be used.

Such a construction is found to be advantageous in that a field in substantially one direction is generated. A preferred number is two if a field in one direction is desired. If a field in three directions is desired, the preferred number is six. The actual card reading part of the card reader is preferably present in between the coils or magnets of the magnetization means.

Preferably, a reference sensor is present in de card reader in order to measure the external magnetic field. With said measurement the magnetic field can be calibrated. Furthermore, the card reader may contain heating means, such as an infrared lamp or another local heat source, or the provision of a flow of fluid or gas at a specified temperature. A thermometer may be present as well.

In a further embodiment, the coil of the card reader is part of a degaussing circuit. Such a degaussing circuit is known per se from the art of cathode ray tubes. It may be used to provide an adequate magnetization of permanent magnetic particles, such that any prior existing magnetization becomes irrelevant. A preferred example of a degaussing circuit comprises a dual PTC thermistor, and a shunt capacitor parallel to the coil to prevent disturbances.

It is a fourth object to provide a method of initializing the semiconductor device of the invention.

It is a fifth object to provide a method of checking the authenticity of the semiconductor device of the invention.

The fourth object is realized in a method of initializing the semiconductor device of the invention, in that it comprises the steps of: determining an initial actual value of the impedance of the security element, and storing the initial actual value as the reference value in a memory.

The fifth object is realized in a method of checking the authenticity of the semiconductor device of the invention, which device has been initialized, comprising the steps of:
  determining an actual value of the impedance of the security element,
  reading the reference value from the memory,
  comparing the actual value and the reference value, and
  recognizing the authenticity of the semiconductor device only if the difference between the actual value and the reference value is smaller than a predefined threshold value.

The method of initializing the semiconductor device is necessary, because before the initialization no actual value of the impedance of the security element is known. The method of checking the authenticity has the advantage that both the actual value and the reference value are available and can be compared. The actual value is available and physically fixed in the semiconductor device. The reference value may be available in the semiconductor device, but is alternatively available in a central database device to which the card reader has access, or which is incorporated in the card reader. The reference value could also be present both in the semiconductor device and in the central database device. It will be understood that the method can be repeated if a plurality of security elements is present.

The predefined threshold value is generally very small, for example preferably below 5% of the reference value, and is to be defined in order -to correct uncertainties of measurements or influences of temperature and other external conditions. It is noted that under normal conditions there will be a plurality of security elements, each with their own impedances. It may thus be expected that all impedances, or at least a proportion of them, must be compared with the corresponding reference values before the authenticity of the semiconductor device can be recognized completely.

If the reference value is stored in a memory of the central database device, the method of checking the authenticity can be interpreted as a method of identifying the semiconductor device as well; for example, instead of checking whether the actual value is equal to the reference value belonging to an already known identity of the semiconductor device, the actual value can be used to find a corresponding reference value in the database, and thus the identity of the semiconductor device. The use of the reference values in conjunction with a central database device is generally referred to as a unique chip identifier code.

In a preferred embodiment, the step of determining the actual value comprises the steps of:
  measuring an off-state value at a standard external magnetic field;
  generating an external magnetic field to induce a magnetization in the magnetic particles substantially perpendicular to the security layer;
  measuring an on-state value before the external magnetic field is switched off,
  determining an actual value of the impedance as the difference between the on-state value and the off-state value, As was explained above, only the magnetic particles whose magnetization can be permanently fixed can be measured directly. For other magnetic particles it is necessary to apply an external magnetic field before measuring. This external field is preferably generated in the card reader. In order to have a calibrated actual value, it is measured as the difference between an off-state value at a standard, preferably zero external field, and an on-state value at the external magnetic field.

If the magnetic particles or at least a proportion thereof contain a hard-magnetic material, a preliminary treatment is necessary to remove any existing magnetization in the magnetic particles in the direction substantially perpendicular to the security layer. Such a preliminary treatment may be a degaussing treatment, such as described above in more detail.

If the magnetic particles or at least a proportion thereof contain a soft-magnetic material, a relaxation measurement maybe performed, comprising the steps of:
  generating an external magnetic field to induce a magnetization in the magnetic particles substantially perpendicular to the security layer;
  measuring a first and a second value before the particles of the softmagnetic particles are relaxed to their saturation magnetization, and
  determining the actual value of the impedance of the security element as the difference between the first and the second value.

This relaxation measurement offers a specific response. The number of values to be measured depends on the relaxation time of the soft-magnetic material, which is known per se. The actual value is determined as the difference between the second and the first value in order to correct for drift effects. If a large number of values is measured, the difference can be calculated between the measured value and the first value, or between consecutive values. The measurement can be optimized in that, after measurement of the first and the second value, an external magnetic field is generated in the opposite direction and further values are measured.

These and other aspects of the semiconductor device and the methods of initializing it and checking its authenticity according to the invention will be further explained with reference to the drawings, in which.

Figure 5A:
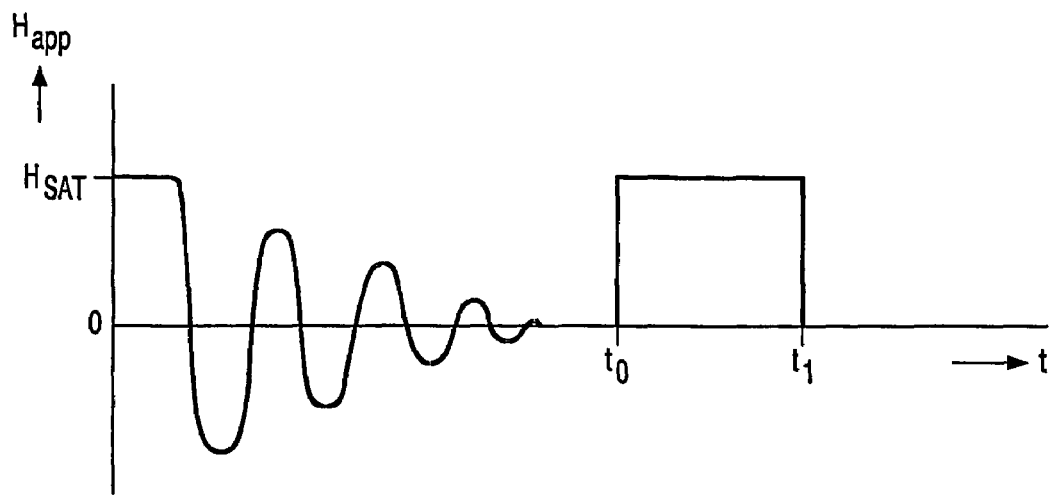
Figure 5B:
Figure 5C:
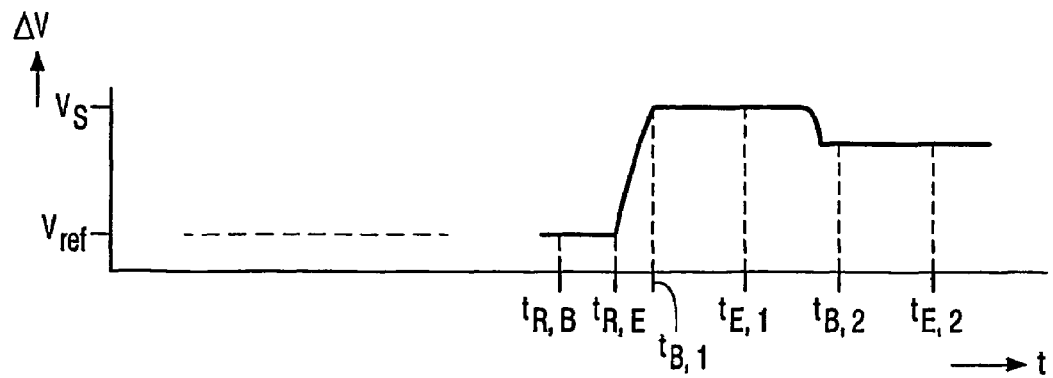
Figure 6A:
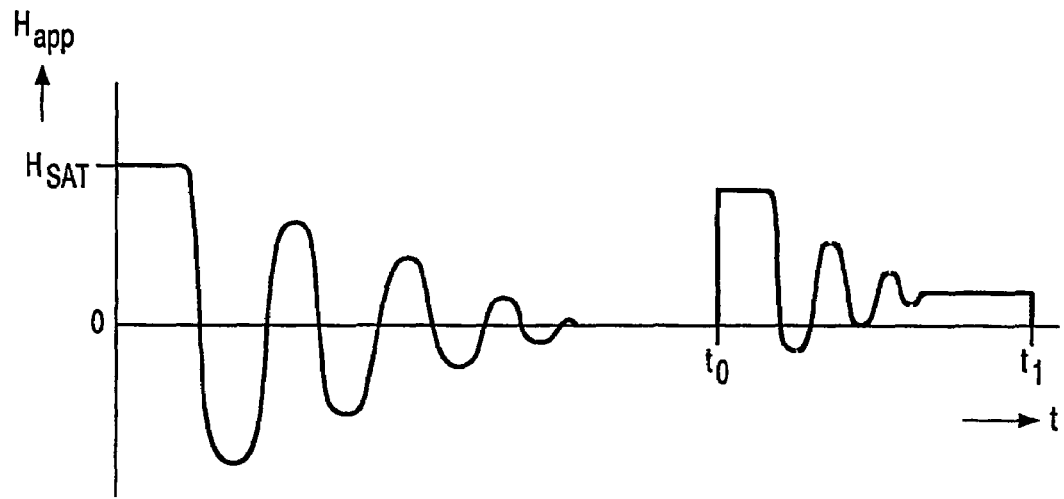
Figure 6B:
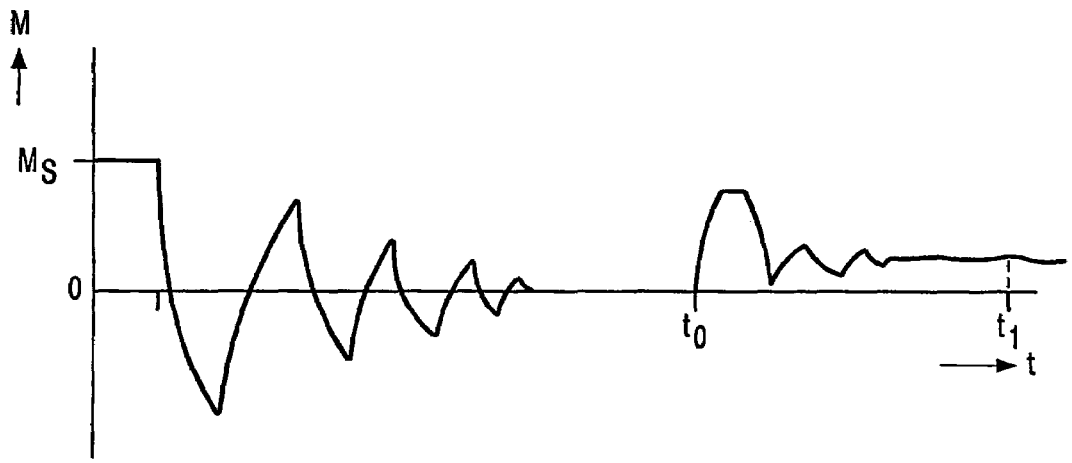
Figure 6C:
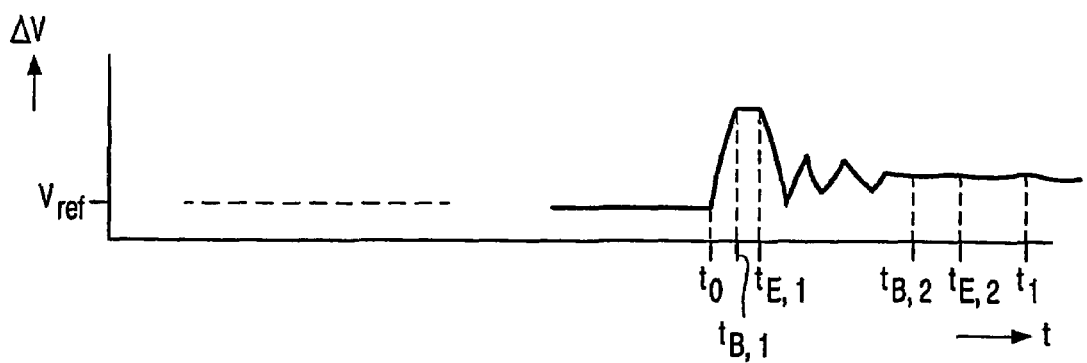
Figure 7:
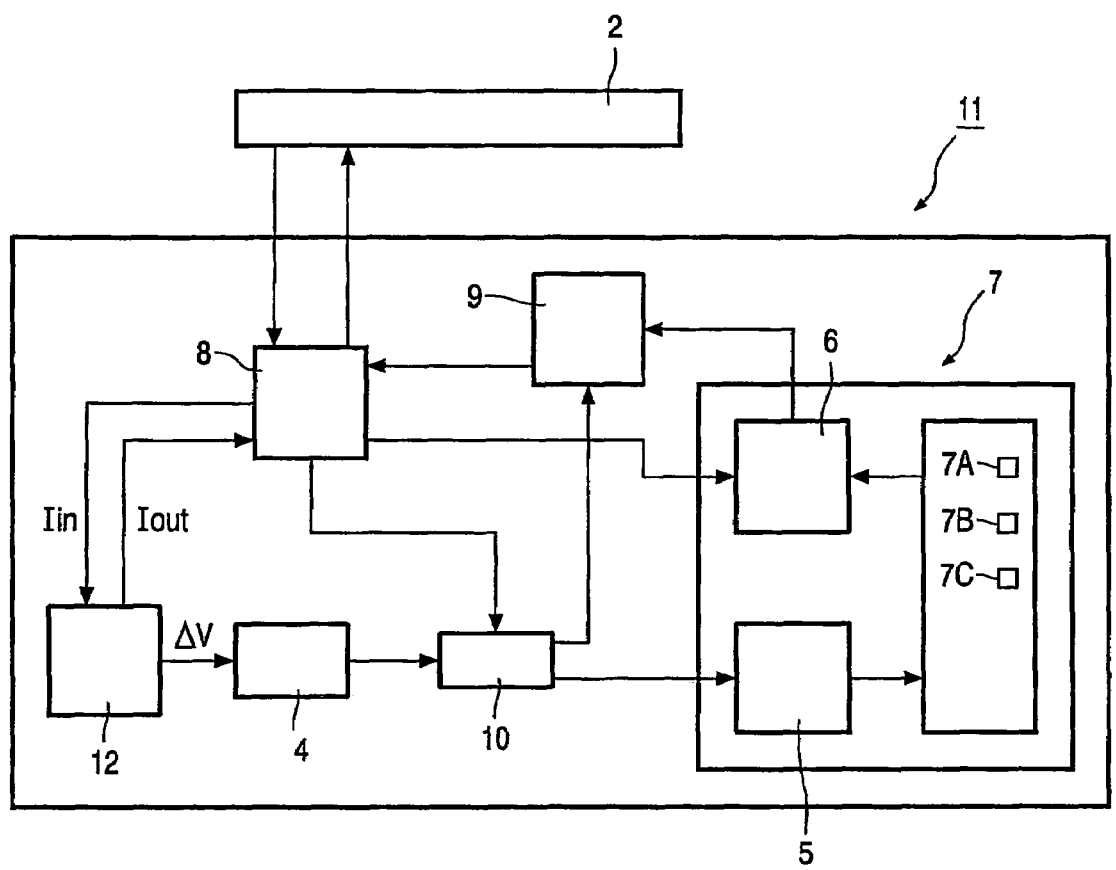

FIGS. 5A–C show graphs of the applied field, the magnetization and the measured voltage difference as a function of time for the embodiment with magnetic particles of hard-magnetic material, wherein measurement takes place at the saturation field;

FIGS. 6A–C show graphs of the applied field, the magnetization, and the measured voltage difference as -a function of time for the embodiment with magnetic particles of hard-magnetic material, wherein measurement takes place at a field of less than the saturation field; and FIG. 7 is a schematic diagram of the semiconductor device.

The Figures are schematically drawn and not true to scale, and equal reference numbers in different Figures refer to corresponding elements. It will be clear to those skilled in the art that alternative but equivalent embodiments of the invention are possible without deviation from the true inventive concept, and that the scope of the invention will be limited by the claims only.

Figure 1:
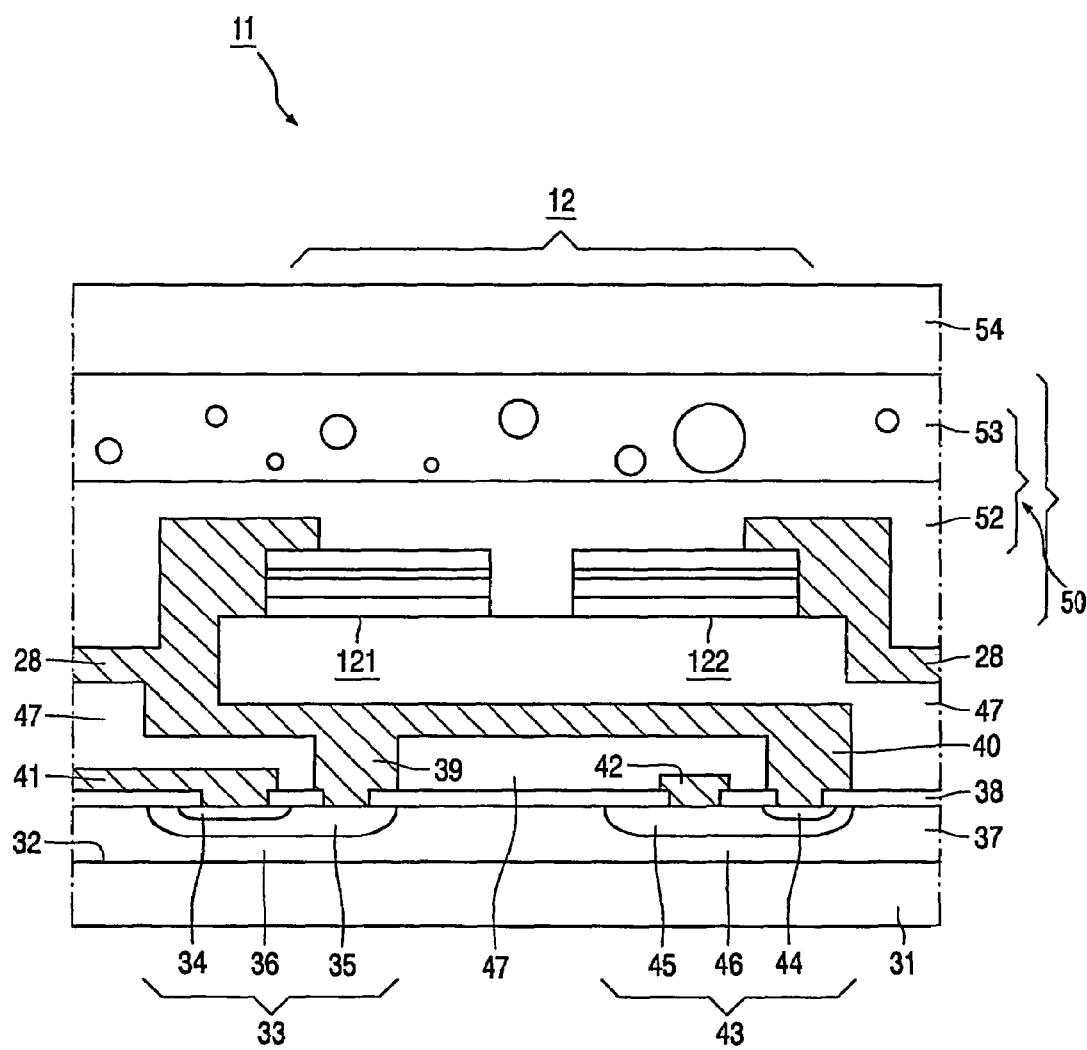
FIG. 1 is a diagrammatical cross-section of the semiconductor device.

In FIG. 1, the semiconductor device 11 has a substrate 31 of silicon, having a—first—side 32. On this side 32, the device 11 is provided with a first active element 33 and a second active element 43. These active elements 33, 43 are bipolar transistors with emitter regions 34, 44; base regions 35, 45 and collector regions 36,46 in this example. Said regions 34–36, 44–46 are provided in a first layer 37, which is covered with a patterned insulating layer 38 of silicon oxide. The insulating layer 38 is patterned such that it has contact windows at the emitter regions 34, 44 and the base regions 35, 45. As known to those skilled in the art, field effect transistors may be present instead of or besides the bipolar transistor. As is further known to those skilled in the art, other elements such as capacitors, resistors, and diodes may be integrated in the semiconductor device 11. The active elements are interconnected so as to form a circuit.

At these contact windows in the insulating layer 38, the said regions are connected to interconnects 39, 40, 41, 42. The interconnects in this embodiment extend at a first level and a second level. As is generally known, the interconnect structure may comprise more levels. A barrier layer not shown is generally present between the interconnects and the active elements. The interconnects 39, 40,41,42 are manufactured, for example, in Al or in Cu, in a known manner and are covered and mutually insulated by dielectric layers 47 that preferably have a low dielectric constant. Additionally, present barrier layers are not shown. A third-level interconnect 28 is present to connect the security element 12, comprising a first and a second magnetoresistive sensor 121, 122 and a local area of a passivation structure 50.

This passivation structure 50 in this embodiment comprises a passivating layer 52 of $Si_xN_y$ with a thickness of 0.60 $\mu$m. Under the passivating layer 52 a further layer of phosphosilicate glass may be present. The passivation structure further comprises a security layer 53 of aluminophosphate with a thickness of 2–10 $\mu$m in which magnetic particles are embedded. $TiO_2$ and TiN particles are also present in order to stabilize the security layer 53 and to decrease the transparency of the layer. A planarizing not shown layer may be present below the passivating layer 52. The security layer 53 was applied by spincoating a composition of 15% by weight of monoaluminumphosphate, 20–50% by weight of particles in water and subsequent drying at about 100–150° C. Alternatively, it may be applied by spraycoating a composition of 5–10% by weight of monoaluminumphosphate. After drying, the layer is annealed at 400–500° C. to allow condensation, whereupon a transition from the fluid to the solid phase takes place. On the security layer 52 an epoxy material is present as a package 54. The security layer 53 may be patterned, so as to facilitate sawing of the wafer into separate dies, and to define contact pads for connection to a PCB, for example.

The sensors 121, 122 are at a mutual distance of about 1 micrometer. Their functioning will be explained in more detail with reference to the FIGS. 2 and 3. The sensors 121,122 may be present at greater mutual distances. If, however, the distance is smaller than 2 microns, the measurement is improved. This is due to the fact that magnetic particles that are present in between the sensors will induce magnetization in opposite directions in the sensors, and thus different changes in the impedance.

Figure 2:
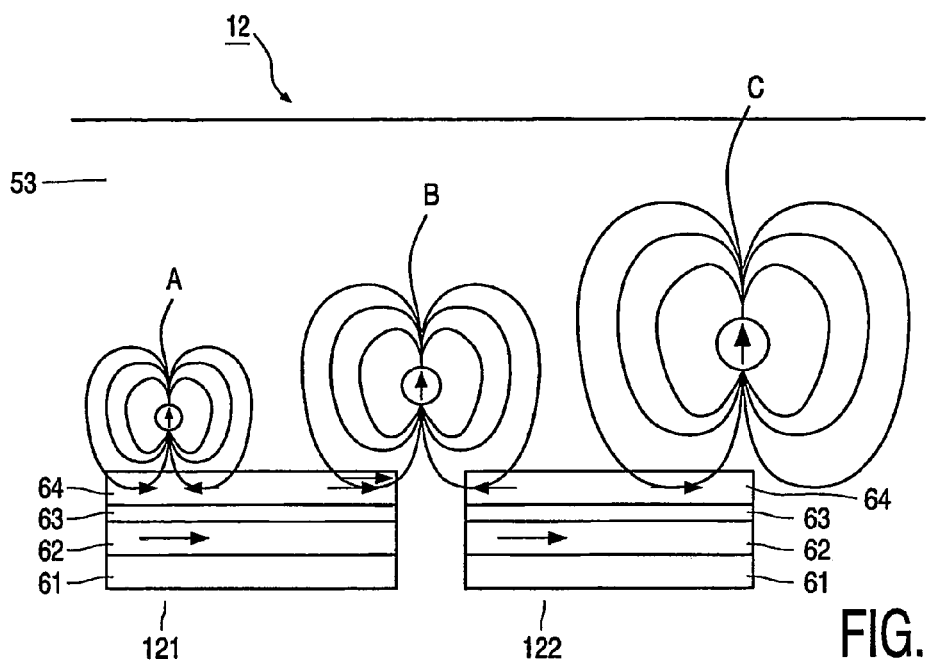
FIG. 2 is a diagrammatical cross-section of a security element in the semiconductor device.

FIG. 2 is a diagrammatical cross-section of a detail of the security element 12. The magnetoresistive sensors 121, 122 each comprise a stack of four main layers: a pinning layer 61, a pinned layer 62, a spacer layer 63, and a free layer 64. The pinning layer 61 is an antiferromagnet, in this case a 10 nm thick $Ir_{20}Mn_{80}$ layer. It may be insulated from the underlying structure through one or more buffer layers, such as 3 nm thick layers of Ta and/or $Ni_{80}Fe_{20}$. The pinned layers 62—in this case 6 nm Co—has a magnetization that is not variable owing to the influence of the pinning layers 61. It is preferred that the magnetization of the pinned layers 62 of the magnetoresistive sensors 121, 122 are in parallel directions. The output voltage of the bridge is then not sensitive to a uniform external magnetic field. The spacer layer 63 comprises a conductive material such as Cu with a thickness of 3 nm in the preferred case of a GMR sensor. In the case of a TMR sensor, an insulating material such as $Al_2O_3$ with a thickness of 1 nm is applied. The free layer 64 comprises a soft-magnetic material such as $Ni_{80}Fe_{20}$ with a thickness of about 6 nm.

FIG. 2 shows the situation that there are three superparamagnetic particles present in the security layer 53 near to the magnetoresistive sensors 121,122, of which the axis of sensitivity is parallel to the direction of the magnetization in the pinned magnetic layers 62 (the x-axis). The particles are of different size and are present at different distances and angles with respect to the sensors 121,122. After application of a magnetic field that is oriented perpendicularly to the plane, with a time dependence that will be further explained with reference to FIG. 4, a perpendicular magnetization will be induced in the particles. This results in a dipolar field around the particle, as indicated schematically in the Figure by magnetic field lines. The dipolar field from the magnetic particles A, B, and C will exert a magnetic torque on the magnetization of the free layers 64 of the sensors 121, 122, which in the absence of the dipolar fields are oriented substantially parallel to the y-direction (i.e. the direction perpendicular to the plane of drawing). The torque depends on the distance in the x and z (perpendicular to the layer plane) directions between the particles A, B, C and the sensor, and is proportional to the strength of the magnetization of the particles A,B,C. As a consequence, rotations of the magnetization are induced in the free layers 64. The directions and sizes of these magnetization rotations are determined by the directions and sizes of the effective (layer-averaged) x-components of the magnetic fields induced by the magnetic particles A,B,C. The magnitude of these fields, at distinct positions in the sensor plane, is symbolized in the Figure by the lengths of the arrows. As a consequence, there is a net magnetization rotation to the right (i.e. in the positive x-direction) in the first sensor 121 and a net magnetization rotation to the left in the second sensor 122. The net x-component of the magnetization of the free layer 64 in the first sensor 121 is thus greater than that of the free layer 64 in the second sensor 122. The resistance of the magnetoresistive sensors 121,122 depends on the angle between the magnetization directions of the pinned and the free layer 62,64. As a consequence, the resistance of the sensor 121 is decreased compared to average, whereas the resistance of the sensor 122 is increased.

Figure 3A:
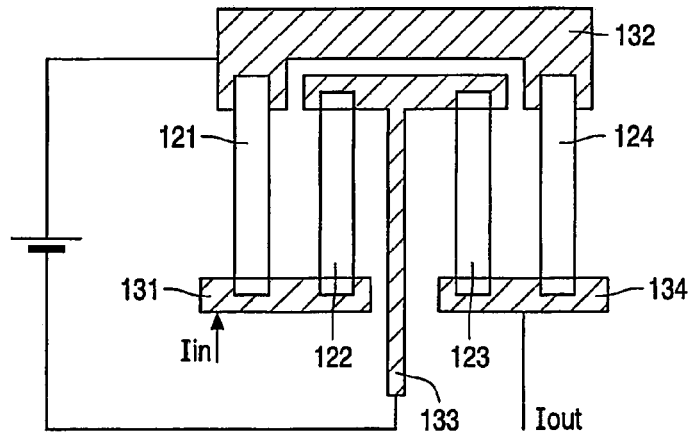
FIG. 3A is a diagrammatical plan view of the security element.
Figure 3B:
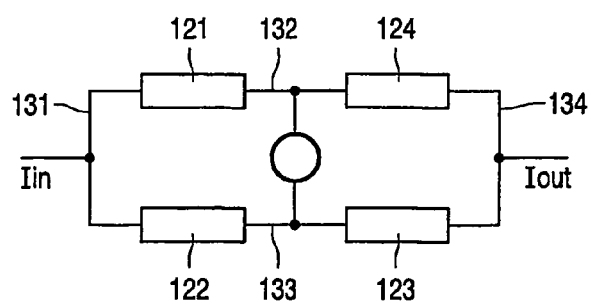
FIG. 3B is a circuit diagram corresponding to the security element shown in FIG. 3A FIGS. 4A–C show graphs of the applied field, the magnetization, and the measured voltage difference as a function of time for the embodiment with magnetic particles of superparamagnetic material.

FIG. 3*a* is a diagrammatic plan view of the security element 12. FIG. 3*b* shows an equivalent circuit diagram. The security element 12 is a Wheatstone bridge. The parts 123, 124 may be either equal non-magnetic resistors or magnetoresistive sensors, preferably of the same type as the sensors 121, 122. Although preferred, it is not necessary that the parts 123,124 have the same physical dimensions as the sensors 121,122. The security element 12 comprises, besides the parts 121–124 and the security layer (not shown), electrodes 131–134. The first electrode 131 is a current input, the second and the third electrode 132,133 are mutually connected via a voltage measurement. Conversion means are present to convert an output current or voltage from the security element into an actual value of the impedance. The conversion means will be further explained with reference to FIG. 7. The fourth electrode 134 is a current output. It is observed that the shape of the Wheatstone bridge as shown in FIG. 3*a* is not essential for the embodiment. This is due to the randomness of the distribution of the magnetic particles.

Figure 4A:
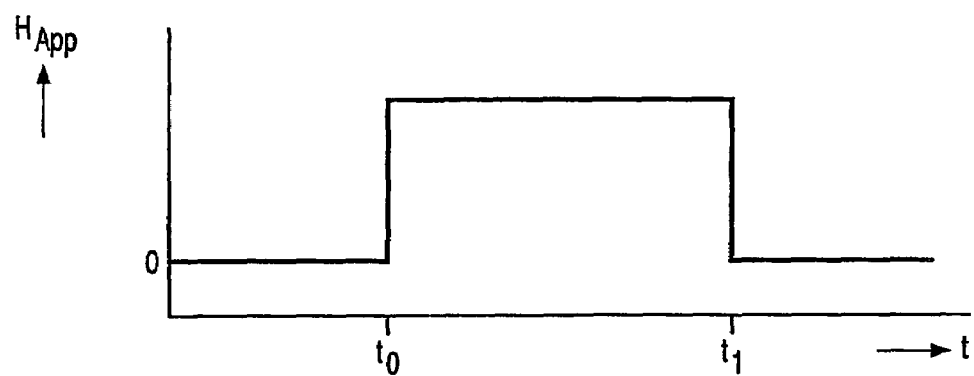
Figure 4B:
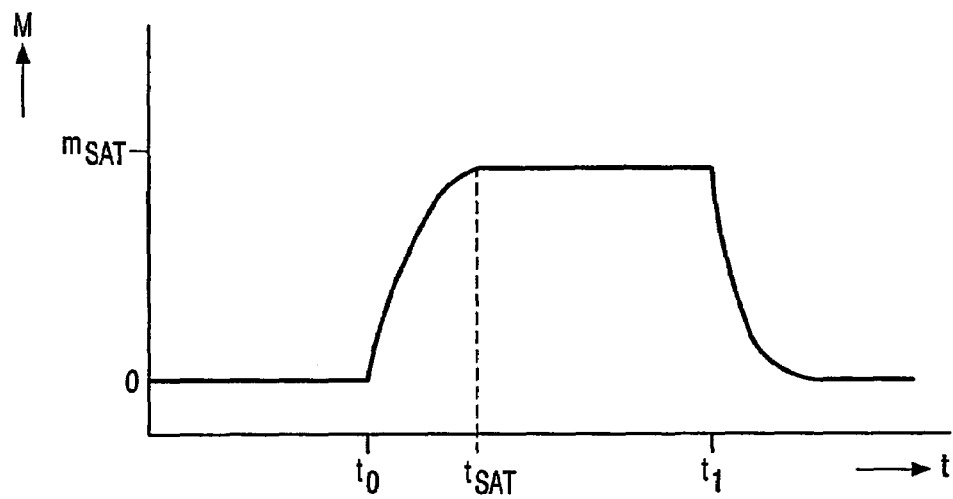
Figure 4C:
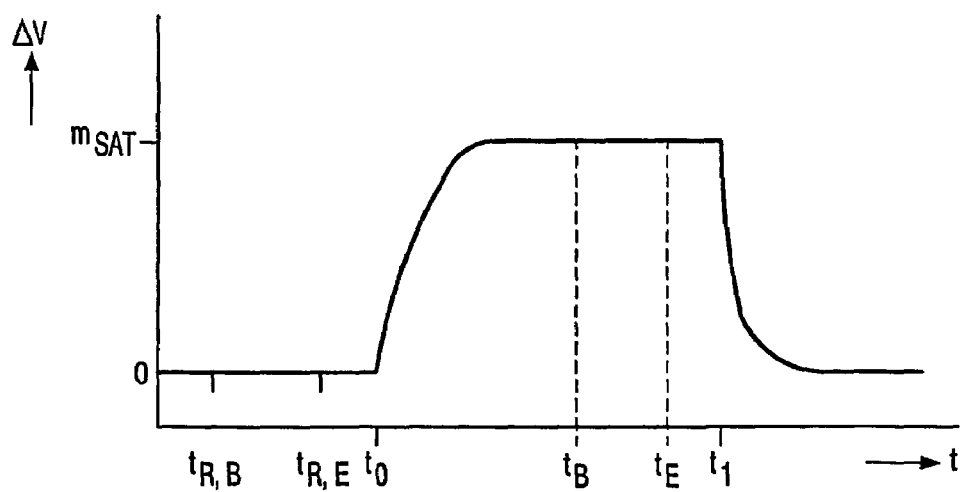

FIGS. 4, 5, and 6 show graphs of the applied field, the magnetization, and the measured voltage difference for three embodiments of the invention. FIG. 4 relates to the embodiment with superparamagnetic particles. FIGS. 5 and 6 relate to the embodiment with hardmagnetic particles of which a reference state is defined prior to the measurement. In FIG. 5 shows a measurement at the saturation field, and FIG. 6 a measurement at a degaussed field of less than the saturation field.

When superparamagnetic particles are used, the magnetization of the particles is zero before the application of an external field. Therefore one can perform an a off-state measurement of the output voltage of the Wheatstone bridge immediately. This measurement will begin at $t_{R,B}$ and end at $t_{R,E}$. Then the external magnetic field $H_{app}$ is applied at $t_0$. This will lead to an increase of the magnetization of the particles M to their saturation value $M_{sat}$, on a time scale that is determined by the relaxation time or the relaxation time distribution of the particles. The magnetization then remains stable as long as the field $H_{app}$ is present, and a measurement of the voltage difference $\Delta V$ can be made. This on-state measurement will begin at $t_B$ and end at $t_E$. Finally at $t_1$, the external magnetic field $H_{app}$ will drop switched off and the magnetization M and the voltage difference $\Delta V$ will reduce to their reference values. The actual value is determined as the difference between the on-state measurement and the off-state measurement. Alternatively, the measurement of the voltage difference may be carried out as a function of time. This is of most interest if the relaxation time is of the order of the time $t_1$.

When using hard-magnetic particles of which the coercive field is smaller than or of the same order of magnitude as the maximum uncontrolled external field that is allowed, a pretreatment is necessary to remove any remanent magnetization. A preferred method for this is a degaussing treatment. In such a degaussing treatment, as shown in FIG. 5A, an oscillatory external magnetic field is applied with alternating directions and decreasing maximum strengths. Then the off-state measurement is made, the external field $H_{app}$ is applied to $t_0$, and the on-state measurement is performed from $t_{B,1}$ to $t_{E,1}$. The actual value is again determined as the difference between the on-state and the off-state values. After switching off of the field $H_{app}$ at $t_1$, a remanent magnetization will usually still in be present. This remanent magnetization, which is a materials property, can be used for an additional measurement, from $t_{B,2}$ to $t_{E,2}$.

Alternatively, the measurement may be preceded by a degaussing treatment in a specified manner that is different from that used for obtaining the reference state, for example degaussing around a certain bias field, as is shown in FIG. 6. The subsequent measurement may take place at a finite field, for example the bias field around which degaussing has taken place. It may also take place after the external final field has been switched off.

FIG. 7 is a diagram of an embodiment of the semiconductor device 11 together with an access device 2. The semiconductor device 11 comprises various means: measuring means 4, memory 7, control means 8, and a verification control 9. Furthermore, the semiconductor device comprises a plurality of security elements 12 as well as a switch 10. The memory 7 comprises a plurality of memory elements 7A, 7B, 7C . . . , as well as a storage control 5 and read control 6. The control means 8 and the verification control 9 may be integrated into one function, this being a microprocessor, or a dedicated circuit. The control means 8 need not be dedicated solely to the control of the measuring, storing, and reading of the impedances of the security elements 12, but may control the functioning of the complete semiconductor device, including a further memory with financial or identity data. The access device 2 is generally a card reader, but may be another device, for example an apparatus with which the initialization is done.

This example of a exemplary circuit in the semiconductor device 11 functions as follows: a signal is sent from the access device 2 to the semiconductor device 11 requesting the initialization or authenticity check. Values of the impedances of the security elements 12 are measured via control means 8, and are sent to conversion means 4 with a frequency depending on the impedance, and then go via a switch 10 to the memory 7. The conversion means generally comprise an oscillator, a counter, and a reference oscillator to provide a clock frequency, or a standard A/D converter. The result is a digitized signal, representing the actual value of the impedance of the measured security element. It may be present in any kind of SI-unit, but also in any device-specific value if it is not to be compared with any externally measured value. Depending on the switch 10, the actual value may be stored or provided to the verification control 9. The switch is preferably switchable only once, for example in that it comprises a fuse. It is not excluded, as will be apparent to those skilled in the art, that the switch 10 and the storage control 5 are integrated into one functional unit. The verification control 9 will compare the actual value and the reference value. If the difference between the two values is smaller than a predefined threshold value, for example 3%, then a positive signal—stating okay—will be sent to the control means 8. This may be done immediately or after all the actual values have been compared with all reference values, or after comparison of a selected number of the actual values have been compared with the corresponding reference values. The predefined threshold value will be dependent on the precision of the measuring means. It could be 10 or 20% as well, especially if the number of security elements is large, for instance 10 or more. It could be less than 1% as well, which is partially dependent on the customer's wishes and the state of the art of integrated circuit design.

The invention claimed is:

1. A semiconductor device provided with a circuit, a security layer that covers the circuit, a security element comprising a local area of the security layer, and a sensor, characterized in that:
   the security layer comprises embedded magnetic particles, and
   the sensor is a magnetic sensor, capable of measuring of a magnetic property of the security layer.

2. A semiconductor device as claimed in claim 1, characterized in that the magnetic sensor is a magnetoresistive sensor, capable of converting the magnetic properties into an actual value of the impedance.

3. A semiconductor device as claimed in claim 1, characterized in that the embedded magnetic particles are distributed inhomogeneously in the security layer over the circuit.

4. A semiconductor device as claimed in claim 1, characterized in that the magnetic particles are superparamagnetic particles embedded in microbeads.

5. A semiconductor device as claimed in claim 1, characterized in that the magnetic particles comprise a hard-magnetic material.

6. A semiconductor device as claimed in claim 2, characterized in that the magnetoresistive sensors having an axis of sensitivity substantially parallel to the security layer are shaped as stripes that have a length in a direction substantially perpendicular to the axis of sensitivity.

7. A semiconductor device as claimed in claim 1, further provided with a memory for storing an initial actual value of the impedance of the security element as a reference value.

8. A carrier provided with a semiconductor device as claimed in claim 1.

9. A card reader suitable for a carrier as claimed in claim 8, characterized in that magnetization means are present in order to generate an external magnetic field that will induce a magnetization in the magnetic particles substantially perpendicular to the security layer.

10. A card reader as claimed in claim 9, characterized in that a reference sensor is present for measuring the external magnetic field, so that the external magnetic field can be calibrated.

11. A card reader as claimed in claim 9, characterized in that the magnetization means are part of a degaussing circuit.

* * * * *